US012690140B2

(12) United States Patent
Gi

(10) Patent No.: US 12,690,140 B2
(45) Date of Patent: Jul. 21, 2026

(54) CIRCUIT BOARD AND METHOD FOR MANUFACTURING THE SAME

(71) Applicant: SAMSUNG ELECTRO-MECHANICS CO., LTD., Suwon-si (KR)

(72) Inventor: Myungju Gi, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 202 days.

(21) Appl. No.: 18/503,462

(22) Filed: Nov. 7, 2023

(65) Prior Publication Data

US 2024/0284604 A1     Aug. 22, 2024

(30) Foreign Application Priority Data

Feb. 20, 2023     (KR) ........................ 10-2023-0022416

(51) Int. Cl.
*H05K 3/46*          (2006.01)
*H05K 1/03*          (2006.01)
(Continued)

(52) U.S. Cl.
CPC ........... *H05K 3/4608* (2013.01); *H05K 1/036* (2013.01); *H05K 1/113* (2013.01); *H05K 1/115* (2013.01);
(Continued)

(58) Field of Classification Search
CPC ...... H05K 3/4608; H05K 1/036; H05K 1/113; H05K 1/115; H05K 3/0014; H05K 2203/0323; H05K 2203/308; H05K 3/4697; H05K 3/4682; H05K 1/02; H05K 1/185; H05K 3/0017; H05K 3/181
See application file for complete search history.

(56) References Cited

U.S. PATENT DOCUMENTS

2011/0284269 A1     11/2011   Maeda et al.
2015/0366062 A1*    12/2015   Noda ................ H01L 23/49827
                                                                361/803

(Continued)

FOREIGN PATENT DOCUMENTS

JP            5566771 B2       8/2014
KR    10-2016-0090625 A       8/2016
(Continued)

OTHER PUBLICATIONS

Office Action dated Apr. 23, 2026 of the corresponding Korean Patent Application No. 10-2023-0022416 with English translation (Note: KR 10-2017-0087765 A and US 2015-0366062 A1 cited therein are already of record.).

*Primary Examiner* — Timothy J Thompson
(74) *Attorney, Agent, or Firm* — Morgan, Lewis & Bockius LLP

(57)                ABSTRACT

Disclosed is a circuit board including: an insulation layer for burying at least one wire layer and at least one via layer and having a first side and a second side facing each other, and a first wire layer partly protruding over the first side of the insulation layer and partly buried in the insulation layer, wherein the insulation layer has a concave cavity dented from the first side, and part of the via layer is exposed from the insulation layer through a bottom side of the cavity.

8 Claims, 11 Drawing Sheets

(51) Int. Cl.
      *H05K 1/11*           (2006.01)
      *H05K 3/00*         (2006.01)

(52) U.S. Cl.
      CPC ... *H05K 3/0014* (2013.01); *H05K 2203/0323*
                                      (2013.01)

(56)                 References Cited

U.S. PATENT DOCUMENTS

2016/0050752 A1 *   2/2016   Kang ..................... H05K 3/243
                                            174/257
2016/0219713 A1 *   7/2016   Kim ..................... H05K 1/0207
2021/0057397 A1      2/2021   Kang et al.
2022/0262713 A1      8/2022   Na et al.

FOREIGN PATENT DOCUMENTS

KR         20170087765 A  *  7/2017
KR     10-2021-0000105 A    1/2021

* cited by examiner

<u>100</u>

CIRCUIT BOARD AND METHOD FOR MANUFACTURING THE SAME

CROSS-REFERENCE TO RELATED APPLICATION

This application claims priority to and the benefit of Korean Patent Application No. 10-2023-0022416 filed in the Korean Intellectual Property Office on Feb. 20, 2023, the entire contents of which are incorporated herein by reference.

TECHNICAL FIELD

The present disclosure relates to a circuit board and a manufacturing method thereof.

BACKGROUND

A circuit board is generated by forming circuit patterns on an insulating material with a conductive material such as copper, and as electronic devices in the IT field including mobile phones are down-sizing, methods for forming cavities in the circuit board and mounting electronic parts such as ICs, active elements, or passive elements in the cavities are proposed.

In general, the cavity is formed by an exterior processing. In this case, carbonization and foreign particles may be generated in the cavity, the substrate may be contaminated, and a yield may be deteriorated. Further, a desmear process for removing foreign particles is additionally progressed and a processing time is increased.

Therefore, there are needs on developing methods for forming the cavities by using a circuit process and not the exterior process.

The above information disclosed in this Background section is only for enhancement of understanding of the background of the disclosure, and therefore it may contain information that does not form the prior art that is already known in this country to a person of ordinary skill in the art.

SUMMARY OF THE DISCLOSURE

The present disclosure has been made in an effort to provide a circuit board for reducing an entire package thickness, removing an exterior process and a de-smearing process, and reducing a processing time, and a manufacturing method thereof.

The present disclosure has been made in an effort to provide a circuit board for easily controlling a size and a height of a cavity, forming a cavity with a uniform size and an excellent matching force, and increasing a yield of a circuit board, and a manufacturing method thereof.

The object of the present disclosure is not limited to the above-described object, and it may be expanded in various ways in the range of the ideas and the areas of the present disclosure.

An embodiment of the present disclosure provides a circuit board including: an insulation layer, in which at least one wire layer and a via layer, the insulating layer having a first side and a second side opposing each other; and a first wire layer partly protruding over the first side of the insulation layer and partly disposed in the insulation layer. The insulation layer has a concave cavity dented from the first side, and a part of the via layer is exposed from the insulation layer through a bottom side of the cavity.

The circuit board may further include a surface processing layer disposed on a surface of the first wire layer protruding from the first side of the insulation layer.

The surface processing layer may include nickel, palladium, and gold.

The surface processing layer may include nickel, palladium, or gold.

A bottom side and an internal side of the cavity may have a same surface roughness.

The circuit board may further include a solder resist layer disposed on the second side of the insulation layer.

A surface roughness of the bottom side of the cavity may be the same as the surface roughness of the first side of the insulation layer.

The via layer may have a tapered shape such that an end of the via layer exposed from the insulation layer has a width less than that of another end of the via layer embedded in the insulation layer.

Another embodiment of the present disclosure provides a method for manufacturing a circuit board including: forming a cavity pattern layer on a carrier substrate; forming a cavity conductive layer on the cavity pattern layer; forming a first insulation layer to bury the cavity pattern layer and the cavity conductive layer; separating the cavity pattern layer and the first insulation layer from the carrier substrate; and forming a cavity in the first insulation layer by etching the cavity pattern layer and the cavity conductive layer.

The method may further include forming a first conductive layer in a region excluding a region in which the cavity pattern layer is formed on the carrier substrate, and after forming the cavity, etching the first conductive layer to remove the first conductive layer.

The method may further include forming a first wire layer on the first conductive layer.

The method may further include forming a second conductive layer in a region in which the first wire layer is not formed on the first conductive layer such that the second conductive layer covers a portion of a side surface of the first wire layer.

The method may further include at least partly exposing the first wire layer by removing the second conductive layer.

The method may further include forming a surface processing layer on a surface of the first wire layer exposed to an outside of the first insulation layer by an electroless Ni electroless Pd immersion gold (ENEPIG) method.

The method may further include forming a first via layer to penetrate at least a part of the first insulation layer and allow at least a part to contact the cavity conductive layer.

One end of the first via layer may be exposed by removing the cavity conductive layer.

The first via layer may be formed to have a tapered shape such that an end of the first via layer contacting the cavity conductive layer has a width less than that of another end of the first via layer.

The method may further include forming at least one insulation layer, at least one wire layer, and at least one via layer on the first insulation layer.

The forming of a cavity pattern layer may include forming a copper pattern layer.

According to the circuit board and the manufacturing method thereof according to the embodiment, the entire package thickness may be reduced, the exterior process and the desmearing process may be removed, and the processing time may be reduced.

According to the circuit board and the manufacturing method thereof according to the embodiment, it may be easy to control the size and the height of the cavity, the cavity with the uniform size and the excellent matching force may be formed, and the yield of the circuit board may be increased.

DETAILED DESCRIPTION OF THE EMBODIMENTS

Figure 1:
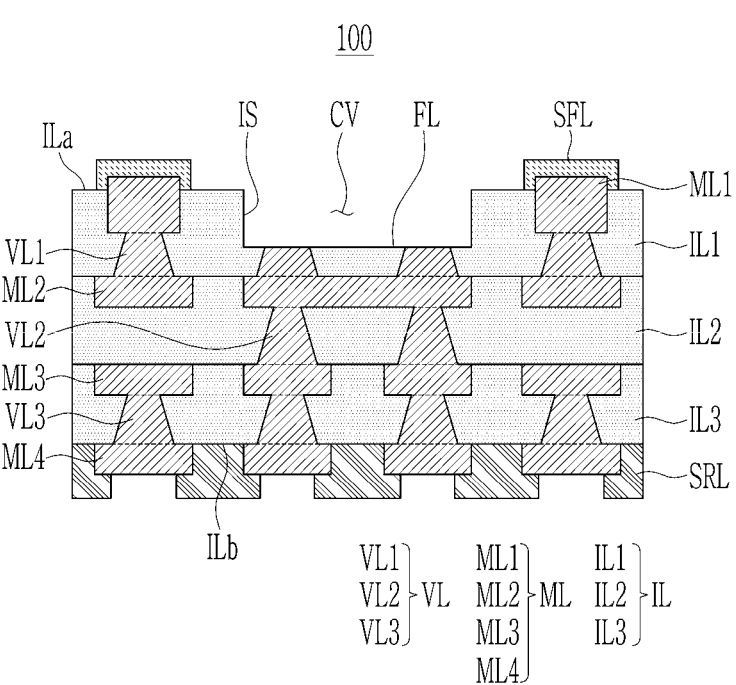
FIG. 1 shows a cross-sectional view of a circuit board according to an embodiment.

The present disclosure will be described more fully hereinafter with reference to the accompanying drawings, in which embodiments of the disclosure are shown. The drawings and description are to be regarded as illustrative in nature and not restrictive. Like reference numerals designate like elements throughout the specification. Some constituent elements are exaggerated, omitted, or briefly illustrated in the added drawings, and sizes of the respective constituent elements do not reflect the actual sizes.

The accompanying drawings are provided only in order to allow embodiments disclosed in the present specification to be easily understood and are not to be interpreted as limiting the spirit disclosed in the present specification, and it is to be understood that the present disclosure includes all modifications, equivalents, and substitutions without departing from the scope and spirit of the present disclosure.

Terms including ordinal numbers such as first, second, and the like will be used only to describe various constituent elements, and are not to be interpreted as limiting these constituent elements. The terms are only used to differentiate one constituent element from other constituent elements.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

It should be understood that the term "include", "comprise", "have", or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance. Unless explicitly described to the contrary, the word "comprise" and variations such as "comprises" or "comprising" will be understood to imply the inclusion of stated elements but not the exclusion of any other elements.

The phrase "in a plan view" or "on a plane" means viewing a target portion from the top, and the phrase "in a cross-sectional view" or "on a cross-section" means viewing a cross-section formed by perpendicularly cutting a target portion from the side.

Throughout the specification, when it is described that a part is "coupled" to another part, the part may be "directly or physically connected" to the other part or "indirectly or non-contact coupled" to the other part with a third part therebetween.

Throughout the specification, when it is described that a part is "connected" to another part, the part may be "directly connected" to the other element, may be "connected" to the other part through a third part, or may be connected to the other part physically or electrically, and may be referred to by different titles depending on positions or functions, but respective portions that are substantially integrated into one body may be connected to each other.

Various embodiment and variations will now be described with reference to accompanying drawings.

A circuit board according to an embodiment will now be described with reference to FIG. 1.

FIG. 1 shows a cross-sectional view of a circuit board according to an embodiment.

Referring to FIG. 1, the circuit board 100 may include an insulation layer IL for burying at least one wire layer ML and at least one via layer VL and having a first side ILa and a second side ILb opposing each other, and a first wire layer ML1 partly protruding on the first side ILa of the insulation layer IL and partly buried in the insulation layer IL. The insulation layer IL may have a cavity CV that is dented from the first side ILa and is concave, and a portion of the via layer VL may be exposed from the insulation layer IL through a bottom side FL of the cavity CV.

The insulation layer IL may be disposed to bury at least one wire layer ML and at least one via layer VL. An insulating material may be used as a material of the insulation layer IL, and the insulating material may include a thermo-curable resin such as an epoxy resin, a thermoplastic resin such as a polyimide, or the above-noted resin to which an inorganic filler such as silica and a reinforcing member such as glass fibers are added. For example, an Ajinomoto-build up film (ABF) may be used as the material of the insulation layer IL, it is however not limited thereto, and a prepreg may be used. If needed, a photosensitive insulating material such as a photo imagable dielectric (PID) may be used as the material of the insulation layer IL.

For example, the insulation layer IL may include a first insulation layer IL1, a second insulation layer IL2 disposed on the first insulation layer IL1, and a third insulation layer IL3 disposed on the second insulation layer.

A cavity CV may be disposed in one side of the first insulation layer IL1. The cavity CV may be dented from the first side ILa of the insulation layer IL that is one side of the first insulation layer IL1 and may have a concave shape. The cavity CV may be formed by an etching process in a process for forming a circuit, and hence, surface roughness of the bottom side FL and the internal side IS of the cavity CV may be the same.

Referring to FIG. 1, the insulation layer IL is shown to include first to third insulation layers IL1, IL2, and IL3, but the insulation layer IL is not limited thereto and may include a greater/lesser number of layers than what is shown.

The wire layer ML may be disposed on one side of the insulation layer IL. The wire layer ML may transmit signals of the circuit board 100. Metallic materials may be used as materials of the wire layer ML. The metallic materials may include copper (Cu), aluminum (Al), silver (Ag), tin (Sn), gold (Au), nickel (Ni), lead (Pb), titanium (Ti), or their alloys. The wire layer ML may perform various functions according to designs such as a ground pattern, a power pattern, or a signal pattern. The above-noted patterns may respectively have a linear shape, a planar shape, or a pad shape. The wire layer disposed on an outermost layer of the wire layers ML may function as a pad for a connection with other substrates or parts.

The wire layer ML may include first to fourth wire layers ML1, ML2, ML3, and ML4. The first wire layer ML1 may partly protrude over the first side ILa of the insulation layer IL, and may partly buried in the insulation layer IL. The first wire layer ML1 may be a bump pad. The first wire layer ML1 may function as a pad for a connection with other substrates or parts. The first wire layer ML1 may be disposed on the first side ILa of the insulation layer IL. The first wire layer ML1 may include a lower portion buried in the insulation layer IL and an upper portion protruding to an outside from the first side ILa of the insulation layer IL. The first wire layer ML1 may include a metal.

The second wire layer ML2 may be disposed on a first side and a second side facing the first side of the first insulation layer IL1 that corresponds to the first side ILa of the insulation layer IL. The third wire layer ML3 may be disposed on one side of the second insulation layer IL2. The fourth insulation layer ML4 may be disposed on one side of the third insulation layer IL3. The second and third wire layers ML2 and ML3 may be buried in the insulation layer IL. The fourth wire layer ML4 disposed on the outermost layer of the circuit board 100 may function as a pad for a connection with other substrates or parts.

Referring to FIG. 1, the first to fourth wire layers ML1, ML2, ML3, and ML4 are shown, but are not limited thereto, and a greater/lesser number of wire layers than what is shown may be disposed.

The via layer VL may be disposed to electrically connect the first to fourth wire layers ML1, ML2, ML3, and ML4 to each other. Respective vias of the via layer VL may have a tapered shape of which a width of a first side is greater than a width of a second side facing the first side. Metallic materials may be used as the material of the via layer VL. The metallic materials may include copper (Cu), aluminum (Al), silver (Ag), tin (Sn), gold (Au), nickel (Ni), lead (Pb), titanium (Ti), or their alloys. The via layer VL may include a signal via, a ground via, and a power via according to designs. The via of the via layer VL may be a via hole completely filled with a metallic material or may be a metallic material formed along a wall side of the via hole. The via layer VL may be formed by a plating process, for example, an additive process (AP), a semi AP (SAP), a modified SAP (MSAP), or tenting (TT). The via layer VL may include a seed layer that is an electroless plating layer and an electroplating layer made based on the seed layer.

The via layer VL may include a first via layer VL1 disposed in the first insulation layer IL1, a second via layer VL2 disposed in the second insulation layer IL2, and a third via layer VL3 disposed in the third insulation layer IL3.

The first via layer VL1 may pass through the first insulation layer IL1 and may be connected to the first wire layer ML1 and the second wire layer ML2. Hence, the first via layer VL1 electrically connect the first wire layer ML1 and the second wire layer ML2. A portion of the via formed in the first via layer VL1 may be exposed through the bottom side FL of the cavity CV so the part disposed in the cavity CV may be electrically connected to the circuit board 100.

The second via layer VL2 may pass through the second insulation layer IL2 and may be connected to the second wire layer ML2 and the third wire layer ML3. Therefore, the second via layer VL2 electrically connect the second wire layer ML2 and the third wire layer ML3.

The third via layer VL3 may pass through the third insulation layer IL3 and may be connected to the third wire layer ML3 and the fourth wire layer ML4. Therefore, the third via layer VL3 may electrically connect the third wire layer ML3 and the fourth wire layer ML4.

Referring to FIG. 1, the first to third via layers VL1, VL2, and VL3 are shown, but are not limited thereto, and a greater number of wire layers or a lesser number of via layers may be disposed if needed.

The surface processing layer SFL may be disposed on a surface of the first wire layer ML1 protruding from the first side ILa of the insulation layer IL. The surface processing layer SFL may be formed to prevent formation of an oxide layer on the surface of the first wire layer ML1. For example, the surface processing layer SFL may be formed by an electroless Ni electroless Pd immersion gold (ENEPIG) method, and may include nickel (Ni), palladium (Pd), and gold (Au). However, without being limited thereto, the surface processing layer SFL may be formed by a surface treatment method known to a person skilled in the art in the circuit board field, such as plating nickel (Ni), tin (Sn), gold (Au), or palladium (Pd), or coating an organic solder ability preservative (OSP).

A solder resist layer SRL may be disposed on the second side ILb of the insulation layer IL to cover a portion of the wire layer ML for the purpose of preventing an unneeded short circuit. The solder resist layer SRL may expose part of the fourth wire layer ML4. The solder resist layer SRL may include a photosensitive resin.

According to the circuit board 100 according to the present embodiment, by using the cavity formed by a circuit process instead of the existing exterior processing, the thickness of the entire package may be reduced, the size and the height of the cavity may be easily controlled, and the cavity with uniform surface roughness of its bottom side and its internal side may be realized.

A method for manufacturing the circuit board 100 according to an embodiment will now be described with reference to FIG. 2 to FIG. 11. FIG. 2 to FIG. 11 show processing diagrams of a method for manufacturing a circuit board according to an embodiment.

Figure 2:
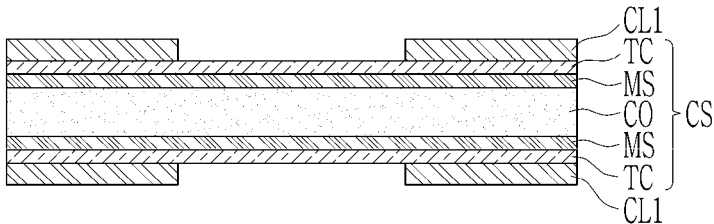
FIG. 2 to FIG. 11 show processing diagrams of a method for manufacturing a circuit board according to an embodiment.

Referring to FIG. 2, a first conductive layer CL1 may be formed on a carrier substrate CS. The carrier substrate CS may include a core CO, a thin film metal layer MS stacked on respective sides of the core CO, and a copper foil layer TC stacked on the thin film metal layer MS. Here, the first conductive layer CL1 may be formed in a region excluding another region in which a cavity pattern layer (CPL, refer to FIG. 3 to FIG. 9) is formed on the carrier substrate CS. For example, a plating resist pattern may be formed on the carrier substrate CS to expose the region to be plated, and an electroless/electroplating process is performed on the exposed region to form a first conductive layer CL1. The plating process may include an additive process (AP), a semi AP (SAP), a modified SAP (MSAP), or tenting (TT). The first conductive layer CL1 may include nickel, and is not limited thereto.

Figure 3:
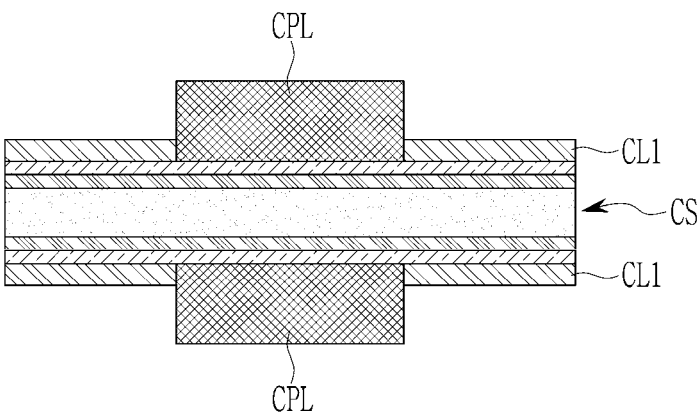

Referring to FIG. 3, a cavity pattern layer CPL may be formed on the carrier substrate CS. Here, the cavity pattern layer CPL may be formed in a region excluding another region in which the first conductive layer CL1 of the carrier substrate CS is formed. The cavity pattern layer CPL may include copper, and is not limited thereto. The cavity pattern layer CPL may be formed to be thicker than the first conductive layer CL1, and edges on respective sides of the cavity pattern layer CPL in a width direction may contact an edge of the first conductive layer CL1.

Figure 4:
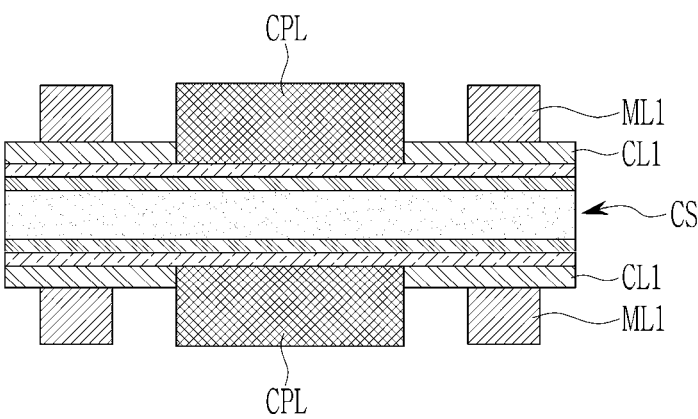

Referring to FIG. 4, a first wire layer ML1 may be formed on the first conductive layer CL1. The first wire layer ML1 may be spaced from the cavity pattern layer CPL.

Figure 5:
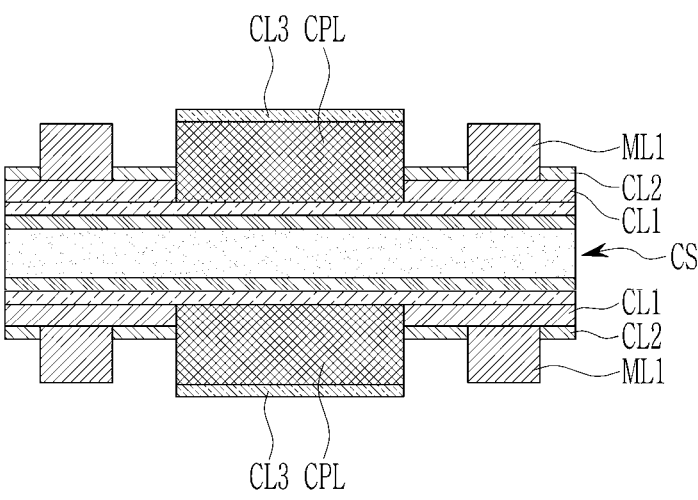

Referring to FIG. 5, a cavity conductive layer CL3 may be formed on the cavity pattern layer CPL. A second conductive layer CL2 may be formed in a region in which the first wire layer ML1 is not formed on the first conductive layer CL1. For example, the region to be plated may be exposed by forming the plating resist pattern, and the cavity conductive layer CL3 and the second conductive layer CL2 may be formed by performing an electroless/electroplating process on the exposed region. The plating process may include an additive process (AP), a semi AP (SAP), a modified SAP (MSAP), or a tenting (TT). The second conductive layer CL2 may surround part of the first wire layer ML1. The second conductive layer CL2 may include nickel and is not limited thereto.

Figure 6:
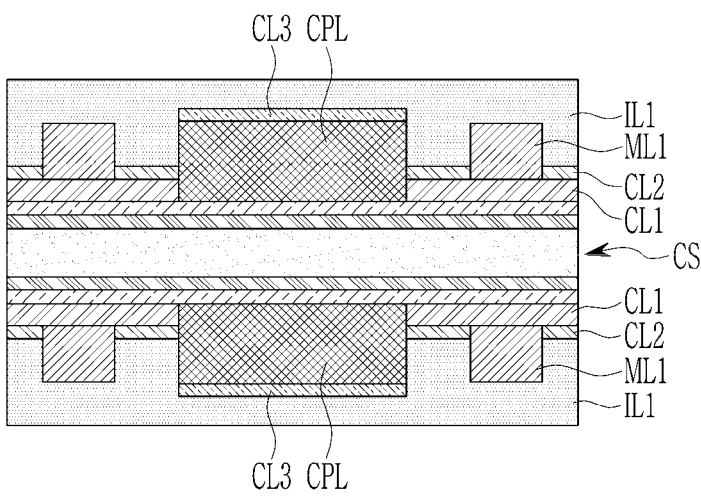

Referring to FIG. 6, a first insulation layer IL1 may be formed so that the cavity pattern layer CPL and the first conductive layer CL1 may be buried.

Figure 7:
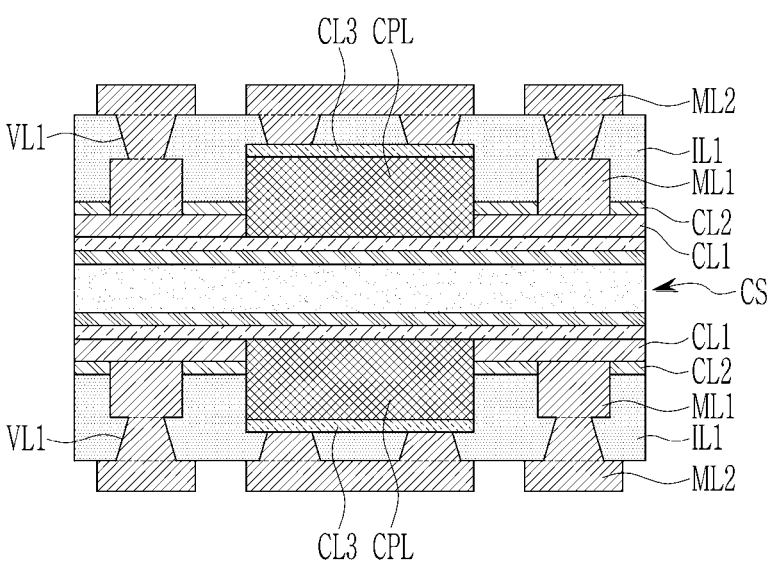

Referring to FIG. 7, a second wire layer ML2 may be formed on the first insulation layer IL1, and a first via layer VL1 may be formed through at least part of the first insulation layer IL1. A partial via of the first via layer VL1 may contact the first conductive layer CL1. In other words, the first via layer VL1 may be formed to be connected to the second wire layer ML2 and the first conductive layer CL1. Another partial via of the first via layer VL1 may contact the first wire layer ML1. In other words, the first via layer VL1 may be formed to be connected to the second wire layer ML2 and the first wire layer ML1.

Figure 8:
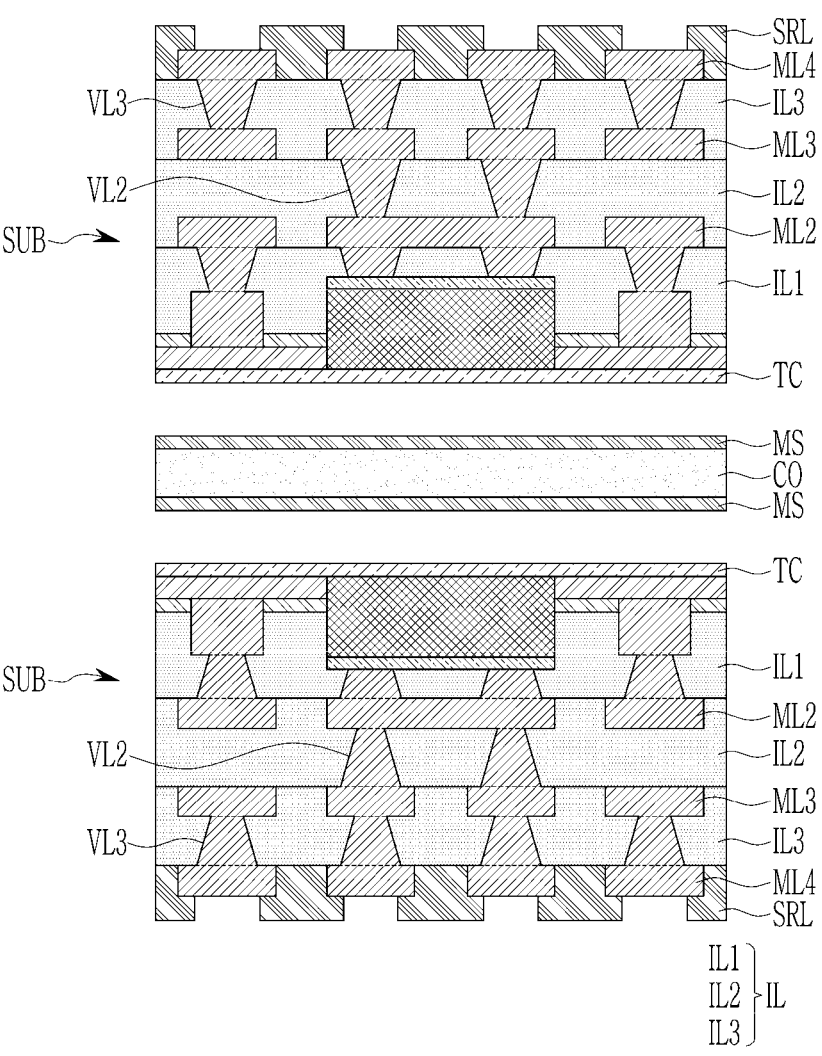

Referring to FIG. 8, at least one insulation layer, at least one wire layer, and at least one via layer may be formed on the first insulation layer IL1, thereby forming a buildup structure. For example, a second insulation layer IL2 may be formed to bury the second wire layer ML2. A third wire layer ML3 may be formed on the second insulation layer IL2, and a second via layer VL2 may be formed through at least part of the second insulation layer IL2. A third insulation layer IL3 may be formed to bury the second insulation layer IL2. A fourth wire layer ML4 may be formed on the third insulation layer IL3, and a third via layer VL3 may be formed through at least part of the third insulation layer IL3. The fourth wire layer ML4 may be disposed on the second side ILb of the insulation layer IL.

A solder resist layer SRL may be formed on one side of the third insulation layer IL3. The solder resist layer SRL may be formed to expose part of the fourth wire layer ML4.

A substrate portion SUB may be separated from respective sides of the carrier substrate CS.

A substrate portion SUB separated from the carrier substrate CS will now be described.

Figure 9:
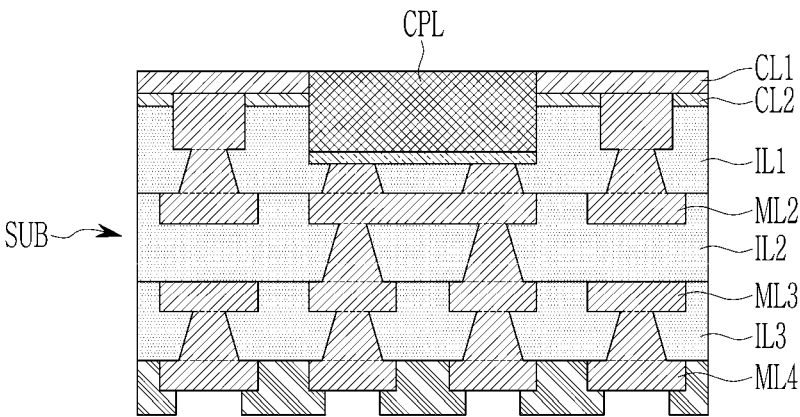

As shown in FIG. 9, the cavity pattern layer CPL and the first conductive layer CL1 may be separated from the carrier substrate CS by removing the copper foil layer TC from the substrate portion SUB.

Figure 10:
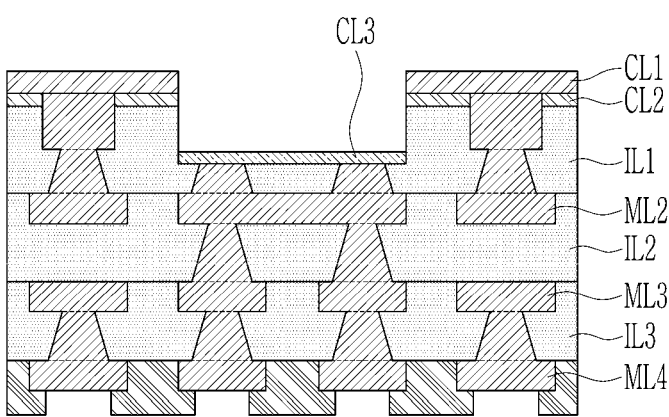
Figure 11:
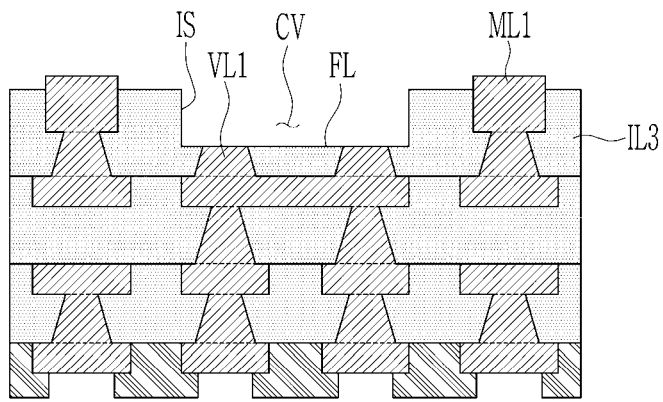

Referring to FIG. 10 and FIG. 11, the cavity CV may be formed by etching and removing the cavity pattern layer CPL and the cavity conductive layer CL3. For example, the cavity pattern layer CPL may be selectively etched by using an etchant. The cavity conductive layer CL3 may be etched by using another etchant. The cavity pattern layer CPL and the cavity conductive layer CL3 may include a metallic material selectively removable by different etchants, for example, the cavity pattern layer CPL may include copper and the cavity conductive layer CL3 may include nickel as described above. However, they are not limited thereto.

The cavity pattern layer CPL and the cavity conductive layer CL3 are removed by the etching process using etchants so the cavity CV may be formed so that the surface roughness of the bottom side FL and the internal side IS of the cavity CV may be the same.

Referring to FIG. 11, the first conductive layer CL1 and the second conductive layer CL2 may be etched and removed. Therefore, a portion surrounded by the second conductive layer CL2 of the first wire layer ML1 may be exposed to the outside, and the first wire layer ML1 so that the same may protrude from one side of the third insulation layer IL3. In other words, the first wire layer ML1 may be at least partially exposed by removing the second conductive layer CL2. Part of the first via layer VL1 may be exposed from the insulation layer IL through the bottom side of the cavity CV.

Referring to FIG. 1, a surface processing layer SFL may be formed on the surface of the first wire layer ML1 exposed to the outside of the first insulation layer IL1, and the circuit board 100 as shown in FIG. 1 may be formed. For example, the surface processing layer SFL may be formed by the ENEPIG method.

According to the method for manufacturing a circuit board 100 according to the present embodiment, the exterior processing and the desmear process may be removed by forming the cavity according to the circuit process instead of the existing exterior processing, and the processing time may be reduced. Further, the size and the height of the cavity may be easily controlled, the cavity with the uniform size and the excellent matching force may be formed, and no foreign particles or carbonization generated for the exterior processing is generated, thereby increasing a yield of the circuit board.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A circuit board comprising:
an insulation layer, in which at least one wire layer and a via layer are disposed, the insulating layer having a first side and a second side opposing each other; and
a first wire layer partly protruding over the first side of the insulation layer and partly disposed in the insulation layer,
wherein the insulation layer has a concave cavity dented in a thickness direction of the circuit board from the first side,
the via layer includes one via having a part exposed from the insulation layer through a bottom side of the cavity and another via connected to the first wire layer, and
a thickness of the one via in the thickness direction is less than a thickness of the another via in the thickness direction.

2. The circuit board of claim 1, further comprising
a surface processing layer disposed on a surface of the first wire layer protruding from the first side of the insulation layer.

3. The circuit board of claim 2, wherein
the surface processing layer includes nickel, palladium, and gold.

4. The circuit board of claim 2, wherein
the surface processing layer includes nickel, palladium, or gold.

5. The circuit board of claim 1, wherein
a bottom side and an internal side of the cavity have a same surface roughness.

6. The circuit board of claim 1, further comprising a solder resist layer disposed on the second side of the
insulation layer.

7. The circuit board of claim 1, wherein a surface roughness of the bottom side of the cavity is the
same as the surface roughness of the first side of the
insulation layer.

8. The circuit board of claim 1, wherein the one via of the via layer has a tapered shape such that
an end of the one via exposed from the insulation layer
has a width less than that of another end of the one via
embedded in the insulation layer.

\* \* \* \* \*